US012761308B2

(12) United States Patent
Mort et al.

(10) Patent No.: US 12,761,308 B2

(45) Date of Patent: Oct. 13, 2026

(54) MULTIPLE-RANGE CALIBRATION FOR PER-PIN PARAMETRIC MEASUREMENT UNIT

(71) Applicant: Analog Devices, Inc., Wilmington, MA (US)

(72) Inventors: Andrew Nathan Mort, Wexford, PA (US); Amit Kumar Singh, Woburn, MA (US); Christopher C. McQuilkin, Hollis, NH (US)

(73) Assignee: Analog Devices, Inc., Wilmington, MA (US)

( * ) Notice: Subject to any disclaimer, the term of this patent is extended or adjusted under 35 U.S.C. 154(b) by 213 days.

(21) Appl. No.: 18/663,893

(22) Filed: May 14, 2024

(65) Prior Publication Data

US 2025/0355072 A1 Nov. 20, 2025

(51) Int. Cl.

*G01R 35/00* (2006.01)

*G01R 31/28* (2006.01)

(52) U.S. Cl.

CPC ....... *G01R 35/005* (2013.01); *G01R 31/2834* (2013.01)

(58) Field of Classification Search

None

See application file for complete search history.

(56) References Cited

U.S. PATENT DOCUMENTS

| | | | |
|---|---|---|---|
| 4,092,589 | A | 5/1978 | Chau et al. |
| 4,456,880 | A | 6/1984 | Warner et al. |
| 5,059,889 | A | 10/1991 | Heaton |
| 5,467,024 | A | 11/1995 | Swapp |
| 5,754,041 | A | 5/1998 | Kaito et al. |
| 5,773,990 | A | 6/1998 | Wilstrup et al. |

(Continued)

FOREIGN PATENT DOCUMENTS

| | | | |
|---|---|---|---|
| CN | 101080641 | A | 11/2007 |
| CN | 101115998 | A | 1/2008 |

(Continued)

OTHER PUBLICATIONS

"German Application Serial No. 10 2020 125 058.4, Office Action mailed Feb. 21, 2025", w/ English machine translation, 12 pgs.

(Continued)

*Primary Examiner* — Farhana A Hoque

(74) *Attorney, Agent, or Firm* — Schwegman Lundberg & Woessner, P.A.

(57) ABSTRACT

A test equipment system can provide signals to, or receive signals from, a device under test (DUT). The test system can include an output stage with output buffer circuitry that can be locally or externally controlled. An external controller can be used to provide precision input signals and, in response, measure current at a DUT interface node of the system, or measure voltage characteristics of various components inside the system. Using the input signals from the external controller, one or more aspects of the test system can be calibrated. For example, resistances of sense resistors in the output stage can be calibrated using current signals received from the external controller. In another example, buffer offset characteristics can be determined using signals from the external controller to control local drive circuitry of the system.

22 Claims, 5 Drawing Sheets

(56) References Cited

U.S. PATENT DOCUMENTS

| | | | |
|---|---|---|---|
| 6,657,455 B2 | 12/2003 | Eldridge et al. | |
| 6,891,355 B2 * | 5/2005 | Kernahan | H02M 3/156 320/132 |
| 7,187,194 B2 | 3/2007 | Robertazzi | |
| 7,292,044 B2 | 11/2007 | Frame | |
| 7,403,030 B2 | 7/2008 | Walker et al. | |
| 7,453,258 B2 | 11/2008 | Miller | |
| 9,923,410 B2 | 3/2018 | Schaedlich | |
| 11,105,843 B2 | 8/2021 | Singh et al. | |
| 11,313,903 B2 | 4/2022 | Singh et al. | |
| 11,686,773 B1 * | 6/2023 | McQuilkin | G01R 31/31924 324/762.01 |
| 2003/0057990 A1 | 3/2003 | West | |
| 2004/0186675 A1 | 9/2004 | Larson et al. | |
| 2006/0202707 A1 | 9/2006 | Harjung | |
| 2006/0279310 A1 | 12/2006 | Walker et al. | |
| 2008/0218173 A1 | 9/2008 | De La Puente | |
| 2009/0179652 A1 | 7/2009 | Obara | |
| 2017/0067959 A1 | 3/2017 | King | |
| 2019/0067056 A1 | 2/2019 | Shen et al. | |
| 2019/0107569 A1 | 4/2019 | Kidd et al. | |
| 2020/0309849 A1 | 10/2020 | Messier et al. | |
| 2020/0400751 A1 | 12/2020 | Weeman | |
| 2021/0109151 A1 | 4/2021 | Singh et al. | |
| 2022/0099738 A1 | 3/2022 | Singh et al. | |

FOREIGN PATENT DOCUMENTS

| | | | |
|---|---|---|---|
| CN | 101345478 | A | 1/2009 |
| CN | 101471142 | A | 7/2009 |
| CN | 102016614 | A | 4/2011 |
| CN | 102053221 | A | 5/2011 |
| CN | 102931669 | A | 2/2013 |
| CN | 107294514 | A | 10/2017 |
| CN | 108603914 | A | 9/2018 |
| CN | 209963757 | U | 1/2020 |
| CN | 112650349 | A | 4/2021 |
| CN | 114325150 | A | 4/2022 |
| CN | 114325532 | A | 4/2022 |
| CN | 114325532 | B | 3/2024 |
| DE | 602005006378 | | 6/2008 |
| DE | 102021106859 | | 9/2021 |
| DE | 102021124919 | A1 | 3/2022 |
| DE | 102021124924 | A1 | 3/2022 |
| EP | 1701174 | B1 | 4/2008 |
| JP | H03183967 | A | 8/1991 |
| JP | H0943284 | A | 2/1997 |
| JP | H11133068 | A | 5/1999 |
| JP | 2002357637 | A | 12/2002 |
| JP | 2007309859 | A | 11/2007 |
| JP | 2010127820 | A | 6/2010 |
| JP | 2011226883 | A | 11/2011 |
| JP | 2013029409 | A | 2/2013 |
| WO | WO-2009090826 | A1 | 7/2009 |
| WO | WO-2018177535 | A1 | 10/2018 |
| WO | WO-2018177536 | A1 | 10/2018 |

OTHER PUBLICATIONS

"German Application Serial No. 102020125058.4, Response filed Jun. 5, 2025 to Office Action mailed Feb. 21, 2025", w/ English claims, 51 pgs.

U.S. Appl. No. 16/598,962 U.S. Pat. No. 11,105,843, filed Oct. 10, 2019, A Robust Architecture for Mode Switching of a Force and Measure Apparatus.

U.S. Appl. No. 17/071,609 U.S. Pat. No. 11,313,903, filed Oct. 15, 2020, Pin Driver and Test Equipment Calibration.

"1.25 GHZ Dual Integrated DCL with PPMU, Level Setting DACs, and On-Chip Calibration Registers", Analog Devices, Inc., (2015), 82 pgs.

"AD5520: Per Pin Parametric Measurement Unit/Source Measure Unit", ADI Datasheet, (2005), 24 pgs.

"U.S. Appl. No. 16/598,962, Notice of Allowance mailed Jun. 14, 2021", 10 pgs.

"U.S. Appl. No. 17/071,609, Non Final Office Action mailed Jan. 28, 2022", 8 pgs.

"U.S. Appl. No. 17/071,609, Notice of Allowance mailed Mar. 7, 2022", 9 pgs.

"U.S. Appl. No. 17/071,609, Response filed Feb. 17, 2022 to Non Final Office Action mailed Jan. 28, 2022", 8 pgs.

"Chinese Application Serial No. 202011079806.6, Office Action mailed Nov. 29, 2021", w/o English translation, 10 pgs.

"Chinese Application Serial No. 202111139994.1, Office Action mailed Jun. 7, 2023", w/o English Translation, 7 pgs.

"Chinese Application Serial No. 202111139994.1, Office Action mailed Sep. 27, 2023", w/o English Translation, 4 pgs.

"Chinese Application Serial No. 202111139994.1, Response Filed Aug. 22, 202023 to Office Action mailed Jun. 7, 2023", W/English Claims, 16 pgs.

"Chinese Application Serial No. 202111139994.1, Response filed Nov. 24, 2023 to Office Action mailed Sep. 27, 2023", w/ English claims, 13 pgs.

"Japanese Application Serial No. 2020-166925, Notification of Reasons for Refusal mailed Oct. 4, 2021", w/ English translation, 7 pgs.

Collins, Edward, "A Design Approach and Integration of a Parametric Measurement Unit onto a 600MHz DCL", Masters Thesis at Northeastern University, Boston, MA, (Sep. 2010), 110 pgs.

"German Application Serial No. 102021124924.4, Office Action mailed Oct. 20, 2025", w/ English machine translation, 15 pgs.

"German Application Serial No. 102021124924.4, Response filed Feb. 19, 2026 to Office Action mailed Oct. 20, 2025", W/O English Claims, 100 pgs.

* cited by examiner

MULTIPLE-RANGE CALIBRATION FOR PER-PIN PARAMETRIC MEASUREMENT UNIT

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple different classes of driver circuits to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a per-pin parametric measurement unit (PPMU or PMU). A PMU can be configured to operate in different modes to provide, or force, a current or voltage signal and to receive, or measure, a corresponding response from a DUT. The operating modes can include, for example, a force voltage measure current (FVMI) mode, a force current measure voltage (FIMV) mode, a force current measure current (FIMI) mode, a force voltage measure voltage (FVMV) mode, or a force nothing measure voltage (FNMV) mode. A PMU can have various force and sense operating ranges that can be modified using, for example, external amplifiers or resistors.

In an example, a test system can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a 50 ohm resistor, which is then connected to the DUT node. Transitions between the three levels can be realized by opening and closing the appropriate switches, such as with one switch closed at any given time. A test system can include other functions, such as an active load and high-speed comparator. The active load can provide the DUT with a bi-directional current source load, and the comparator can serve as a DUT waveform digitizer.

BRIEF SUMMARY

The present inventors have recognized, among other things, that a problem to be solved includes providing a packaged automated test system configured to provide driver, comparator, active load, and per-pin parametric measurement functions. The inventors have recognized the problem includes accommodating the speed and accuracy requirements of, for example, the driver, comparator, and active load circuitry using integrated device structures that occupy minimal die area, while minimizing loading effects at an interface with a device under test (DUT), and while maximizing a functional test range of the system. The problem can include providing a system that is relatively small, inexpensive to produce, consumes less power than traditional systems, or provides higher fidelity performance relative to traditional systems.

The present inventors have further recognized that the problem can include providing a test system that can be calibrated by a user. For example, automated test systems can be provided as a single channel or multiple channel (dual, quad, octal, etc.) solution, such as on the same chip. A user generally calibrates each channel using a reference source or reference force-measure device. In some examples, a user may apply external switches to gain access to a DUT pin on each channel. However, various problems can arise with such switches, including switch size, resistance, loading on the DUT pin, and calibration range.

In an example, a solution to these and other problems can include or use a force-sense system with integrated switches to selectively permit auxiliary control of one or more portions of the force-sense system and to permit DUT access. The force-sense system can include interface nodes for carrying out system-level calibration, and the interface nodes can be configured to provide current or voltage information from a DUT to external calibration circuitry. Interface nodes can be configured to receive auxiliary current and voltage signals, such as can be used to calibrate one or more resistors that are internal to the force-sense system or can be used to control an output of the force-sense system. In an example, the solution can include a diode-protected, externally-accessible node to receive a current signal at a DUT interface node.

In an example, a solution to the various problems articulated above, among others, can include or use a partitioned force-sense system. The solution can include, for example, a first portion of the force-sense system that is implemented using a first integrated circuit, a second portion of the same force-sense system that is implemented using a different second integrated circuit, and a first interface coupling the first and second portions of the force-sense system. In an example, the first interface comprises an electrically conductive, dual-purpose signal path coupling the first and second portions of the force-sense system. The second portion of the force-sense system can be coupled to a DUT interface. In an example, one or more of the switches to enable auxiliary control of the system can be implemented in the first portion of the force-sense system, such as on the first integrated circuit, and one or more others of the switches to enable auxiliary control of the system can be implemented in the second portion of the force-sense system, such as on the second integrated circuit.

In an example, the solution can further include using different semiconductor substrates or different manufacturing processes to implement or build the different first and second portions of the force-sense system. For example, the solution can include using different first and second semiconductor materials for the first and second portions of the force-sense system. In an example, the first portion of the force-sense system can comprise a complementary metal-oxide semiconductor (CMOS) wafer, and the second portion of the force-sense system can comprise a different type of wafer, such as a bipolar device-based wafer. In an example, the solution can include PMU circuitry built using CMOS and bipolar processes, and higher-current driver and active load circuitry built using a different process, such as a bipolar process. In an example, portions of the PMU circuitry can be distributed across dies that are built using different processes with an interface provided between the dies.

This Summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A test system, such as a force-sense test system for use with automated test equipment (ATE), can be configured to provide a voltage or current stimulus to a device under test (DUT) at a specified time, and optionally can measure a response from the DUT. The test system can be configured to provide high fidelity output signal pulses over a relatively large output signal magnitude range to accommodate different tests and different types of devices under test.

In an example, a force-sense system, or force-sense measurement device, can include a pin driver architecture that can provide high fidelity stimulus signals with minimal overshoot or spiking of high frequency current signals, and can enhance pulse edge placement accuracy and signal bandwidth at high or low power operating levels. The test system can include a single-package ATE solution that can include, among other things, a driver circuit, comparator circuit, and active load circuit, and a per-pin parametric measurement unit (PPMU or PMU), sometimes referred to herein as a PMU circuit. The driver, comparator, and active load circuits are referred to herein collectively as a DCL or DCL circuit. In an example, the PMU circuit can be configured for use in high precision, relatively lower frequency, lower bandwidth, and higher amplitude stimulus testing and the DCL circuit can be configured for use in relatively higher frequency and higher bandwidth stimulus testing. Control circuitry can be provided to select a particular force stimulus, such as from the PMU circuit or the DCL circuit, for use in a particular test depending on parameters or requirements of the test. In some examples, operation of the PMU circuit and the DCL circuit can be mutually exclusive such that only one of the circuits interfaces with the DUT at any given time. Various other control circuitry can be provided, such as including digital-to-analog converters (DACs) with on-chip calibration registers to enable use at different DC operating levels.

In an example, the force-sense system can include a single channel or multiple channel system, and each channel can be separately calibrated. The system can include integrated, user-accessible terminals or nodes to receive auxiliary control signals from an external system or user device. The system can be configured to provide information about the test system itself or about information sensed from a DUT using the system or a portion thereof. The system with integrated terminals can help reduce adverse loading and enhance a calibration signal test range (e.g., in terms of signal magnitude or signal bandwidth) over traditional test systems.

Figure 1:
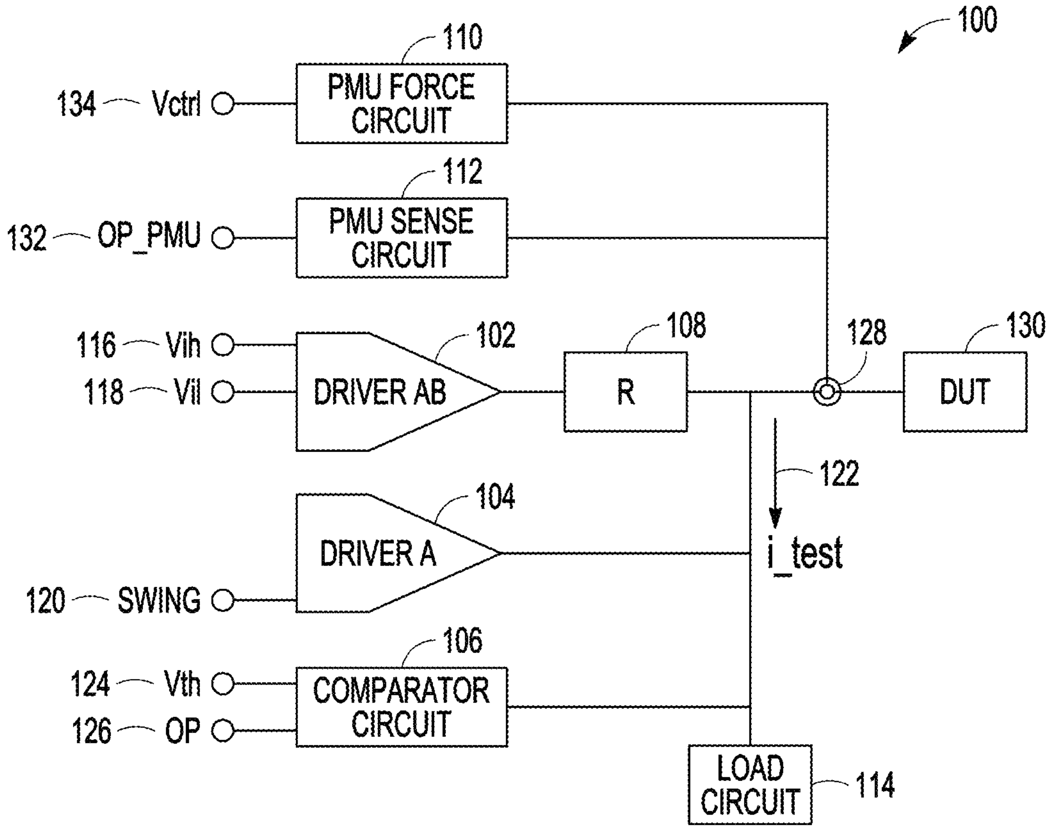
FIG. 1 illustrates generally an example of a force-sense test system topology including multiple driver circuits.

FIG. 1 illustrates generally a first example 100 of a force-sense test system topology including a PMU circuit and a DCL circuit. In the first example 100, the PMU circuit includes a PMU force circuit 110 and a PMU sense circuit 112 coupled to a DUT pin 128, and the DUT pin 128 can be coupled to a DUT 130. In the first example 100, the DCL circuit includes a first DriverAB 102 that can include a class AB driver circuit, and a first DriverA 104 that can include a class A driver circuit. The DCL circuit can include a comparator circuit 106 and a first load circuit 114, such as can include an active load or other loading device. The first example 100 can further include an output element such as a first resistor 108 that can be configured to provide a specified output or load impedance. In an example, the test system is configured to source or sink a first current signal 122, i_test, at the DUT pin 128 that is coupled to the DUT 130. The force-sense test system can be configured to concurrently perform voltage and current measurements on signals received from, or provided to, the DUT 130, such as while applying a voltage or current excitation stimulus to the DUT 130.

In an example, the PMU force circuit 110 can be configured to provide a stimulus using a digitally-configurable amplifier circuit and one or more output buffers. The PMU force circuit 110 can receive a digital control signal, such as a PMU control signal 134 Vctrl, and in response, the PMU force circuit 110 can provide a drive signal at the DUT pin 128. The PMU sense circuit 112 can be configured to receive voltage or current information from the DUT 130, such as using a resistive network. The PMU circuit can include a feedback network to receive test control signals, and the voltage or current information from the DUT 130, to thereby control operation of the PMU force circuit 110. In an example, the PMU sense circuit 112 can be configured to provide a PMU output signal 132 OP_PMU, such as to an external system controller.

In an example, the first DriverAB 102 can be configured to produce a voltage stimulus signal by selecting between parallel-connected diode bridges with each bridge driven by a unique, dedicated DC voltage level. In the first example 100 of FIG. 1, DC voltages Vih 116 and Vil 118 drive diode bridges in the first DriverAB 102. The switching stage can be followed by a voltage buffering stage that can provide power gain, such as can be used to produce large currents to serve a 50 ohm DUT environment.

In contrast with the first DriverAB 102, the first DriverA 104 can be configured to produce transitions at the DUT 130 using a relatively large current switch stage that can be coupled directly to the DUT 130. A current switching stage in the first DriverA 104 can alternately switch current into and out of the DUT 130 in response to a control signal Swing 120, such as can be a voltage control signal. The first DriverA 104 can provide high speed operation, for example, because it may be unburdened by the class AB voltage buffering stage with its attendant bandwidth limitations and other performance limitations.

In an example, the first DriverA 104 can be configured to provide a relatively low amplitude signal at the DUT 130. For example, the first DriverA 104 can provide a signal having about a 2 volt swing. The first DriverAB 102 can be configured to provide a relatively high amplitude signal at the DUT 130, for example, −1.5 to +7 volts. The first DriverA 104 generally operates at a higher switching speed or bandwidth than the first DriverAB 102. In an example, the first DriverAB 102 can be configured to absorb switching currents from the first DriverA 104. That is, the first DriverAB 102 can serve as a buffer that the first DriverA 104 can source current into, such as through the first resistor 108.

One or more of the PMU force circuit 110, the first DriverAB 102 and the first DriverA 104 can be selected to fulfill disparate DUT test requirements that may not otherwise be fulfilled by a single driver. For example, while each of the driver circuits can provide DUT signals or waveforms, the first DriverAB 102 can be configured to provide large amplitude, low bandwidth stimulus signals, and the first DriverA 104 can be configured to provide low amplitude, high bandwidth stimulus signals. The PMU force circuit 110, for example, can be configured to provide high amplitude current and voltage signals such as at DC or low bandwidth levels.

In an example, the PMU circuit and the DCL circuit include respective independent enable control pins. The independent enable controls can help facilitate independent operation of the different circuits. For example, the first DriverAB 102 can serve as a low speed, high voltage stimulus source, or can serve as a static, non-transitioning buffer to absorb switching currents from the first DriverA 104, such as depending on a state of a control signal at the enable control pin of the first DriverAB 102. In an example, the first DriverAB 102 and the first DriverA 104 can be disabled when the PMU circuit is active, and the PMU circuit can be disabled when one of the first DriverAB 102 and the first DriverA 104 is active.

FIG. 1 includes the comparator circuit 106. The comparator circuit 106 can include a multiple-stage comparator that is configured to receive signals from the DUT 130, such as via the DUT pin 128. The comparator circuit 106 can compare the received signals to a comparator reference signal 124 and, in response, provide a differential comparator output signal 126. For example, the comparator circuit 106 can receive a voltage response signal from the DUT 130 and compare an amplitude of the voltage response signal to an amplitude of the comparator reference signal 124. The comparator circuit 106 can provide information about the amplitude relationship using the differential comparator output signal 126, such as can include a digital signal or logic output signal.

Figure 2:
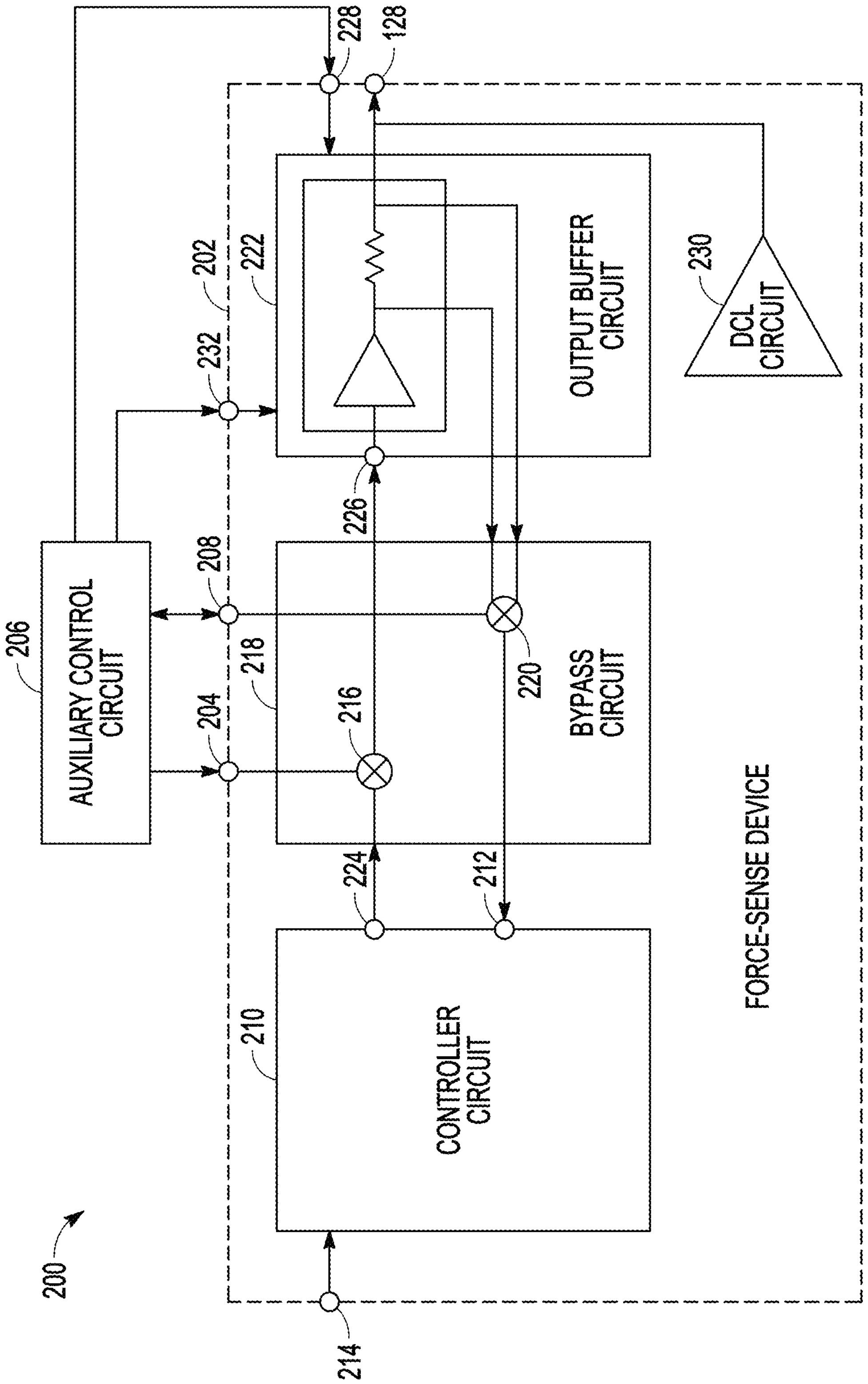
FIG. 2 illustrates generally a schematic example of a test system that includes a controller circuit, a bypass circuit interfaced with an external calibration circuit, and an output buffer circuit.

FIG. 2 illustrates generally a schematic example of a test system that includes a controller circuit, a bypass circuit interfaced with an external calibration circuit, and an output buffer circuit. For example, FIG. 2 includes a first force-sense test system 200 that includes a force-sense device 202 coupled to an auxiliary control circuit 206 that is configured as the external calibration circuit. The force-sense device 202 includes components that comprise a per-pin parametric measurement unit or a PMU circuit, and components that comprise a DCL circuit 230 including other driver, comparator, and active load circuitry. The PMU circuit can be selectively controlled by a local controller, or controller circuit 210, that comprises a portion of the force-sense device 202, or the PMU circuit can be controlled using the auxiliary control circuit 206.

The example of FIG. 2 can include or use various circuits, components, or functional blocks from the example of FIG. 1. For example, the force-sense device 202 can include the PMU circuit coupled to the same DUT pin 128 as the DCL circuit 230, such as similarly described above in the example of FIG. 1. The PMU circuit can be configured to support high precision, low bandwidth or DC force-sense interactions with the DUT 130, and the DCL circuit 230 can be configured to support relatively high speed force-sense interactions with the DUT 130. In the example of FIG. 2, the DCL circuit 230 and the PMU circuit are coupled at the DUT pin 128. The DCL circuit 230 can include the first DriverAB 102, the first DriverA 104, the comparator circuit 106, the first load circuit 114, the first resistor 108, or other circuits or components configured to support relatively high speed force-sense interactions with the DUT 130.

Circuits and components in the force-sense device 202, such as other than those that comprise the DCL circuit 230, can comprise the PMU force circuit 110 and the PMU sense circuit 112. In the example of FIG. 2, the PMU circuit comprises a controller circuit 210, a bypass circuit 218, and an output buffer circuit 222. The PMU circuit can be selectively coupled to the auxiliary control circuit 206 using one or more switches in the bypass circuit 218 or elsewhere. The force-sense device 202 can include a first calibration input node 228, an auxiliary control input node 204, an auxiliary driver input node 232, and a DUT information output node 208 to interface with the auxiliary control circuit 206. The output buffer circuit 222 can be coupled to the DUT pin 128 via an output node, and the output buffer circuit 222 can be coupled to the auxiliary control circuit 206 via the first calibration input node 228.

In the example of FIG. 2, the bypass circuit 218 can be coupled to the auxiliary control circuit 206 via the auxiliary control input node 204 and via the DUT information output node 208. The auxiliary control circuit 206 can be configured to receive information from or about the DUT from the bypass circuit 218, and the auxiliary control circuit 206 can provide auxiliary control of one or more portions of the force-sense device 202, such as control of the output buffer circuit 222. In an example, the auxiliary control circuit 206 can be configured to drive or load the DUT pin 128 directly via the first calibration input node 228.

In an example, the controller circuit 210 can receive a test control signal at a test control input node 214 and can receive information from or about a DUT, such as via a local DUT information node 212. In response to the DUT information and the test control signal, the controller circuit 210 can provide a signal at a force control output node 224. For example, the controller circuit 210 can provide a force control signal or a DUT force signal at the force control output node 224. The controller circuit 210, such as can be understood to be a local controller for the PMU circuit, can provide the force control signal to a buffer control node 226 at the output buffer circuit 222 and, in response, one or more output buffers in the output buffer circuit 222 can be activated and provide a signal at the DUT pin 128. In an example, the controller circuit 210 includes a feedback network that is configured to receive the test control signal and the DUT information from the local DUT information node 212. The feedback network can be used to update characteristics of the force control signal or of the force signal to be provided by the controller circuit 210.

In an example, the bypass circuit 218 can include circuitry that is configured to selectively enable auxiliary control of the output buffer circuit 222. That is, the bypass circuit 218 can select which of multiple different control signals to provide to the output buffer circuit 222 at the buffer control node 226. For example, switching circuitry in the bypass circuit 218 can enable direct communication between the controller circuit 210 and the output buffer circuit 222, or the switching circuitry can interrupt communication from the controller circuit 210 such that the output buffer circuit 222 is under auxiliary control. In the example of FIG. 2, the bypass circuit 218 includes a first switching circuit 216 that can be configured to receive two signals and provide a selected one of the received signals to the output buffer circuit 222. For example, the first switching circuit 216 can be configured to receive a local control signal from the controller circuit 210 via the force control output node 224, and to receive an auxiliary control signal from the auxiliary control circuit 206 via the auxiliary control input node 204. In an example, the auxiliary control signal comprises a voltage signal provided by the auxiliary control circuit 206. The first switching circuit 216 can select the local or auxiliary control signal depending on an operating mode of the first force-sense test system 200. For example, when the PMU circuit is under local control, then the first switching circuit 216 can select the local control signal from the controller circuit 210. When the PMU circuit is under auxiliary control, such as during calibration, then the first switching circuit 216 can select the auxiliary control signal from the auxiliary control circuit 206.

The bypass circuit 218 can further include circuitry configured to control communication of various DUT information to or from the auxiliary control circuit 206. For example, the bypass circuit 218 can use the DUT information output node 208 to communicate current information and/or voltage information about signals received from the DUT to an external system or device, or to the auxiliary control circuit 206. In an example, the bypass circuit 218 can include a second switching circuit 220 that can be configured to receive respective DUT information signals that represent or indicate a DUT voltage or a DUT current. The second switching circuit 220 can route one or more of the DUT information signals to the controller circuit 210 or to the auxiliary control circuit 206, such as depending on the operating mode of the first force-sense test system 200.

In an example, one or more other switching circuits can be provided in the output buffer circuit 222. The one or more other switching circuits can be coupled to the auxiliary driver input node 232. In an example, the auxiliary control circuit 206 can be configured to provide an auxiliary current signal to one or more of the switching circuits in the output buffer circuit 222. The auxiliary current signal can comprise a high-precision current signal generated by the auxiliary control circuit 206, and can be provided to one or more resistors in the output buffer circuit 222. In response to the auxiliary current signal, voltage information can be read from the resistors and used to determine, to a high level of accuracy, the resistance values of the respective resistors.

Figure 3:
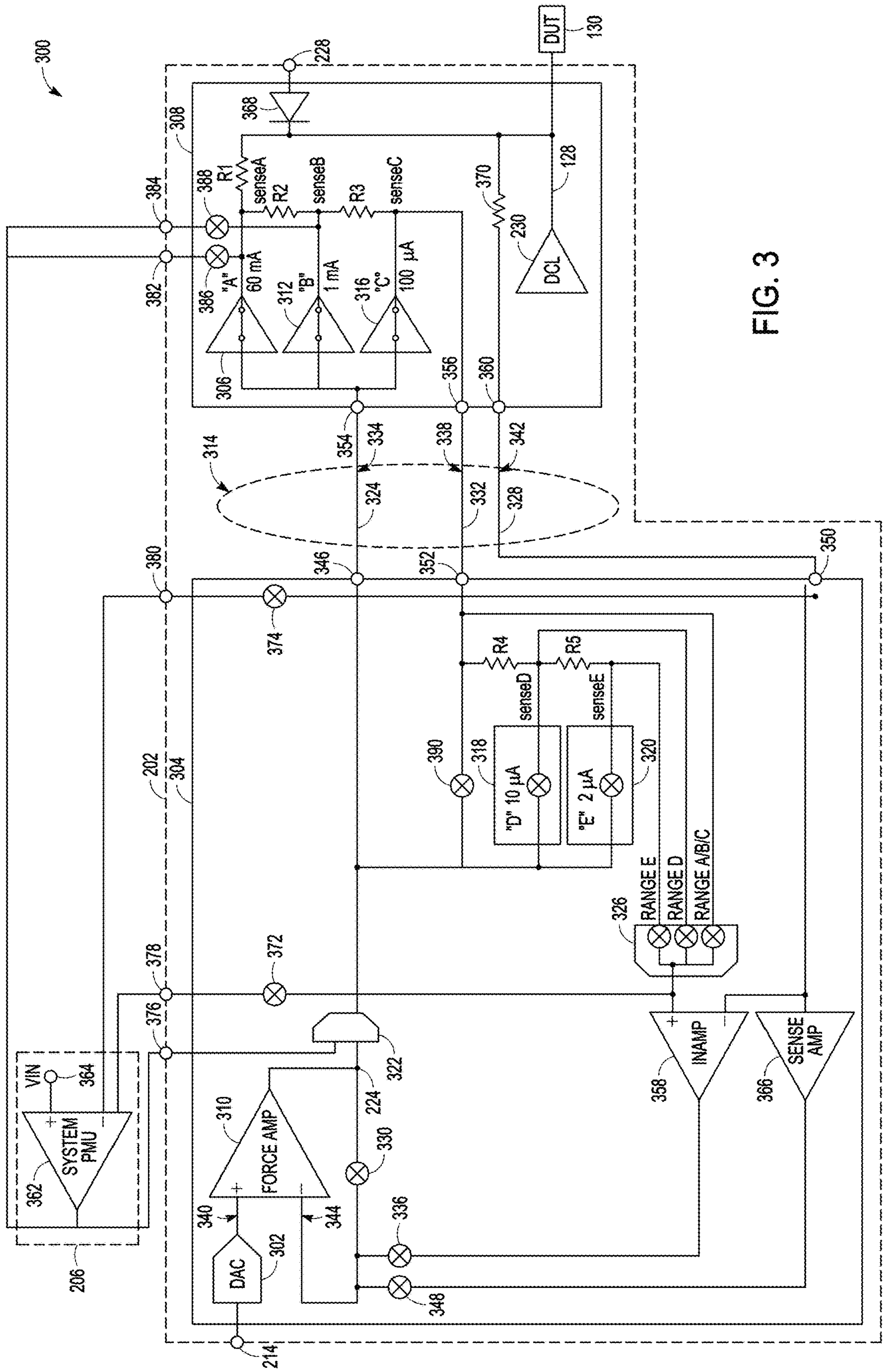
FIG. 3 illustrates generally an example of a partitioned test system with external calibration circuit.

The force-sense device 202 can comprise one integrated circuit, such as can be built using a particular semiconductor die of a particular semiconductor type. In an example, the force-sense device 202 can comprise multiple different integrated circuits (ICs), such as can be built using similar or dissimilar dies or processes. That is, different integrated circuits, such as corresponding to different portions of the force-sense device 202, can comprise different semiconductors of different types. For example, a front-end portion of the PMU circuit can comprise a CMOS-type semiconductor, while other portions of the PMU circuit and/or the DCL circuit 230 can comprise a different type of semiconductor. FIG. 3 illustrates an example that includes portions of the force-sense device 202 built using different semiconductors.

FIG. 3 illustrates generally a schematic example of a test system including a first portion with a parametric measurement unit, and a second portion with a driver, comparator, and active load. For example, FIG. 3 includes a multiple-die force-sense test system 300 that includes the force-sense device 202, the DUT 130, and the auxiliary control circuit 206. The force-sense device 202 includes components that comprise a per-pin parametric measurement unit or a PMU circuit, and components that comprise the DCL circuit 230 including other driver, comparator, and active load circuitry. The force-sense device 202 can be operable in multiple different modes, including a test mode, such as under local control, and an auxiliary control mode. The auxiliary control circuit 206 can be used to operate the force-sense device 202 in the auxiliary control mode. In an example, the auxiliary control mode can be used to calibrate various aspects of the test system and can include a force calibration mode to calibrate output drive or buffer components in the force-sense device 202, and a sense calibration mode to calibrate sense circuitry or sense components (e.g., resistors) in the force-sense device 202.

The example of FIG. 3 illustrates that various aspects of the force-sense device 202 can comprise multiple different semiconductor devices connected using an interface. For example, the multiple-die force-sense test system 300 can include a first semiconductor device 304 coupled to a second semiconductor device 308 using a device interface 314. The second semiconductor device 308 can be coupled to the DUT 130. The different portions of the force-sense device 202 can be built using different semiconductor devices of different semiconductor device types as further discussed below.

The example of FIG. 3 can include or use various circuits, components, or functional blocks from the examples of FIG. 1 and/or FIG. 2. For example, the force-sense device 202 can include the PMU circuit coupled to the same DUT pin 128 as the DCL circuit 230, such as similarly described above. The force-sense device 202 can communicate with the auxiliary control circuit 206 using one or more user-accessible nodes. In an example, the force-sense device 202 can include a first calibration input node 228 configured to receive a calibration test signal from the auxiliary control circuit 206. The force-sense device 202 can include a DUT current sense node 378 configured to provide information about a DUT current signal to the auxiliary control circuit 206, and a DUT voltage sense node 380 configured to provide information about a DUT voltage signal to the auxiliary control circuit 206. The force-sense device 202 can include a first auxiliary input node 376 configured to receive an auxiliary control signal from the auxiliary control circuit 206. The auxiliary control signal can comprise, for example, a voltage signal configured to control buffer circuitry in an output stage of the force-sense device 202. In an example, the force-sense device 202 can include a second auxiliary input node 382 and/or a third auxiliary input node 384 configured to receive an auxiliary drive signal from the auxiliary control circuit 206. The auxiliary drive signal can comprise, for example, a current signal configured to generate a voltage when the current signal is provided to sense resistors in the output stage of the force-sense device 202.

Circuits and components in the force-sense device 202, such as other than those that comprise the DCL circuit 230, can comprise the PMU force circuit 110 and the PMU sense circuit 112 of the PMU in the force-sense device 202. For example, the PMU circuit can include the controller circuit 210, such as in a front-end portion of the PMU circuit, with a digital-to-analog converter circuit, or first DAC 302, and a first force amplifier 310. The first force amplifier 310 can be configured to provide a buffer drive signal.

The PMU circuit can include a force control feedback network with switches that are configured to control a flow of information from the DUT 130 to differential inputs of the first force amplifier 310. For example, the force control feedback network can include a sense amplifier output switch 348 configured to selectively couple an output of a sense amplifier circuit 366 to the first force amplifier 310, an instrumentation amplifier output switch 336 configured to selectively couple an output of an instrumentation amplifier circuit 358 to the first force amplifier 310, and a feedback switch 330 configured to selectively couple an output of the first force amplifier 310 to an input of the first force amplifier 310. The sense amplifier circuit 366 and the instrumentation amplifier circuit 358 can be configured to receive DUT voltage information or DUT current information from the DUT 130 that, in turn, can be used to generate a feedback signal for use by the force control feedback network.

In an example, the DUT circuit includes a DUT sense portion that is configured to receive or measure signals received from the DUT 130 via the DUT pin 128, such as by way of the DUT sense resistor 370 and/or using various force-sense resistors R1-R6. When a value of the DUT sense resistor 370 or the other force-sense resistors is known, information about a current signal from the DUT 130 can be determined based on the voltage across the particular resistor. In an example, the current signal information can be measured using the instrumentation amplifier circuit 358. The instrumentation amplifier circuit 358 can include a differential amplifier circuit that is configured to compare the current signal information from the DUT 130, such as received via the DUT sense resistor 370, with current information at a particular sense node in the output buffer circuitry of the PMU circuit.

In an example, the first DAC 302 can include a test control input node 214 to receive a control signal from an external test controller. A signal at the test control input node 214 can be specified by a user or program, such as to define one or more test parameters. In response to a signal at the test control input node 214, the first DAC 302 can provide a test control signal 340 to the first force amplifier 310. The first force amplifier 310 can receive the test control signal 340 and a DUT information signal 344 and provide, for example via the bypass circuit 218, one of a DUT drive signal for communication to the DUT 130, or a buffer control signal to control one or more buffer circuits in the output buffer circuit 222.

In an example, the force-sense device 202 can include a first selector circuit 322 that is configured to receive information from the controller circuit 210 (not shown in the example of FIG. 3) and from the auxiliary control circuit 206. The first selector circuit 322 in the example of FIG. 3 can correspond to the first switching circuit 216 from the example of FIG. 2. The first selector circuit 322 can be used to receive one or more control signals and provide a selected one of the control signals to the first device output node 346 (e.g., corresponding to the buffer control node 226 from the example of FIG. 2) to thereby control an output signal, or DUT drive signal, provided by one or more output buffers. For example, in a force calibration mode, the first selector circuit 322 can be configured to enable auxiliary control of buffers on the second semiconductor device 308 by communicating a signal from the first auxiliary input node 376 to the second device input node 354 by way of the first device output node 346. That is, in the force calibration mode, a buffer in the output buffer circuit 222 can be under auxiliary control provided by the auxiliary control circuit 206. In a non-calibration mode or test mode, the first selector circuit 322 can be configured to communicate a signal from a local controller, such as the first force amplifier 310, to the second device input node 354 by way of the first device output node 346. The first selector circuit 322 can optionally include a multiplexer circuit, or various switch devices that are operated together in a coordinated manner, or can include a transmission gate or a bootstrapped switch.

In an example, buffers on the second semiconductor device 308, such as comprising the output buffer circuit 222 from the example of FIG. 2, can be configured to provide multiple different signal paths between the first selector circuit 322 and the DUT pin 128. Different buffers, or buffer instances, on the second semiconductor device 308 can be configured to operate mutually exclusively such that only one of the buffer instances operates at a particular time. In other examples, multiple buffer instances can be used together. In the example of FIG. 3, the buffers can include a first buffer circuit 306, a second buffer circuit 312, and a third buffer circuit 316, and each of the buffer circuits can be configured to provide a voltage or current signal in a different voltage or current magnitude range, respectively. Respective outputs of the different buffer circuits can be coupled to respective sense nodes that, in turn, can be coupled to respective portions of a resistive output network. In the example of FIG. 3, an output of the first buffer circuit 306 can be coupled through a first sense resistor R1 to the DUT node or DUT 130. An output of the second buffer circuit 312 can be coupled through a series combination of a second sense resistor R2 and the first sense resistor R1 to the DUT node or DUT 130, and an output of the third buffer circuit 316 can be coupled through a series combination of a third sense resistor R3, the second sense resistor R2, and the first sense resistor R1 to the DUT node or DUT 130. Current magnitude information about a signal provided to the DUT node can be calculated based on resistances of the resistors that comprise the resistive output network and voltage information measured from one or more of the sense nodes in the resistive output network. The same sense nodes of the resistive network can be used to read magnitude information about current signals that are received from the DUT 130.

In some examples, impedance or resistances of one or more of the sense resistors, or offsets of the various buffer circuits, may be unknown, but can be determined using calibration procedures discussed herein. In the example of FIG. 3, force circuitry and sense circuitry of the force-sense device 202 can be calibrated using the auxiliary control circuit 206. The auxiliary control circuit 206 can include, for example, a device or system that is external to the force-sense device 202 and includes a high-accuracy voltage or current source.

The auxiliary control circuit 206 can include a calibration input 364 to receive a user-specified calibration input 364 from an external source. The auxiliary control circuit 206 can include a calibration amplifier 362 configured to receive the calibration input 364 and to receive one of feedback information from the DUT 130 or calibration information from various components inside the force-sense device 202. In an example, the calibration signal, Vin, can be provided by a DAC circuit in response to a digital calibration signal. The feedback information from the DUT 130 can be selectively provided from the force-sense device 202 to the auxiliary control circuit 206, for example, using a first sense switch 372 and a second sense switch 374. The calibration amplifier 362 can be coupled to the force-sense device 202 via the first auxiliary input node 376 and can provide known signals (e.g., based on Vin) to the DUT 130 and to one or more other portions of the force-sense device 202. Response information or other behavior of the DUT or of the force-sense device 202 can be monitored or measured in response to the known drive signals to thereby enable user-calibration of the multiple-die force-sense test system 300.

In an example, in the force calibration mode, the first selector circuit 322 can be configured to transmit a signal from the auxiliary control circuit 206 to the first device output node 346, the feedback switch 330 can be closed, and the first sense switch 372 and the second sense switch 374 can be closed. In the force calibration mode, the first force amplifier 310 can be placed into a feedback mode to help prevent internal damage, such as to various portions of the PMU circuit. That is, in the force calibration mode, the calibration amplifier 362 in the auxiliary control circuit 206 provides a signal to control one or more of the buffers on the second semiconductor device 308 and the controller circuit 210 can be unused.

In the sense calibration mode, DUT sense circuitry, such as including various precision resistors in the force-sense device 202 (e.g., R1-R6 in the example of FIG. 3; referred to herein as sense resistors or output resistors), can be calibrated. In an example, a current calibration signal can be received by the force-sense device 202 at the first calibration input node 228. A first diode 368 can be coupled between the first calibration input node 228 and other circuitry in the force-sense device 202, such as to help protect the other circuitry in the force-sense device 202 from potentially damaging external calibration signals. For example, the first diode 368 can be coupled between the first calibration input node 228 and the resistive network in the second semiconductor device 308. Other switches can optionally be provided at the first calibration input node 228, or between the first diode 368 and one or more of the DUT pin 128, the DCL circuit 230, the DUT sense resistor 370, or other portions of the output buffer circuitry.

Based on information about the current calibration signal and information received from the second selector circuit 326 via the inputs to the second selector circuit 326, accurate resistance values of the various sense resistors (e.g., R1-R6) can be determined. Thus calibration of the force-sense device 202 in each of multiple different current sense and drive ranges can be facilitated by providing a known current calibration signal and then measuring a corresponding response from respective ones of the inputs to the second selector circuit 326.

In an example, resistance information for the first sense resistor R1 can be measured using a known auxiliary current signal provided by the auxiliary control circuit 206. In an example, the auxiliary control circuit 206 can provide the auxiliary current signal to the first sense resistor via a first range switch 386. The first range switch 386 can include a first node coupled to an output of the first buffer circuit 306 and to a first node of the first sense resistor R1 (e.g., node senseA in FIG. 3), and the first range switch 386 can include a second node coupled to the second auxiliary input node 382. When the first range switch 386 is closed, a signal path is provided from the auxiliary control circuit 206, through the first sense resistor R1, to the DUT node. The DCL circuit 230 can be enabled to thereby present a low impedance path that can absorb the auxiliary current signal. A voltage across the first sense resistor R1 can then be measured by the auxiliary control circuit 206 using, for example, signal information received via the first sense switch 372 and the second sense switch 374. Accordingly, the resistance of the first sense resistor R1 can be determined based on known information about the voltage across R1 and known information about the auxiliary current signal.

Similarly, resistance information for the second sense resistor R2 can be measured using an auxiliary drive signal provided by the auxiliary control circuit 206 via a second range switch 388. The second range switch 388 can include a first node coupled to an output of the second buffer circuit 312 and to a first node of the second sense resistor R2 (e.g., node senseB in FIG. 3), and the second range switch 388 can include a second node coupled to the third auxiliary input node 384. When the second range switch 388 is closed, a signal path is provided from the auxiliary control circuit 206, through a series combination of the first sense resistor R1 and the second sense resistor R2, to the DUT 130. A voltage across the series combination of the first and second sense resistors can be measured by the auxiliary control circuit 206 using, for example, signal information received via the first sense switch 372 and the second sense switch 374. Since the voltage across the series combination of the first and second sense resistors is known, the auxiliary current signal is known, and the resistance of the first sense resistor R1 is known (e.g., from a prior calibration step, as described above), the resistance of the series combination of the first and second sense resistors can be calculated and, accordingly, the resistance of the second sense resistor R2 can be calculated.

In an example, the range switches discussed herein (e.g., including the first range switch 386 and second range switch 388) can include physically small, high-impedance switch devices. The switch devices can be fabricated using known processes with CMOS or analog dies. A relatively small reference current used to measure or characterize resistances of the range resistors, and thus the range switches can be physically small. After the resistance values of the sense resistors are measured, larger currents can be generated (e.g., using circuitry internal to the force-sense device 202). The relatively smaller range switches can be turned off when the larger currents are used, and accordingly the signals paths corresponding to the smaller range switches do not carry the larger current signals.

In an example, in a test mode, the first selector circuit 322 can be configured to transmit a signal from the first force amplifier 310 to the first device output node 346, the feedback switch 330 can be open, and the first sense switch 372 and second sense switch 374 can be open. In the test mode, the first force amplifier 310 can provide a signal to control the output buffer circuitry while other drive circuitry, such as the calibration amplifier 362 in the auxiliary control circuit 206, can be unused.

In an example, the force-sense device 202 can be configured for clamping at the DUT pin 128 to help avoid or prevent damage to the force-sense device 202, such as when the device is in a calibration mode. Clamp circuitry can be configured to clamp the output of the first force amplifier 310 if the voltage or current applied to the DUT 130 exceeds specified upper or lower clamp levels. The clamp circuitry also comes into play in the event of a short or open circuit. The clamp circuitry can also protect the DUT 130 if a transient voltage or current spike occurs when changing to a different operating mode, or when programming the device to a different current range. In an example, if a voltage at the DUT pin 128 exceeds a specified threshold voltage during a calibration routine, then the first selector circuit 322 can decouple the auxiliary control circuit 206 and return system control to the controller circuit 210.

Although the example of FIG. 3 illustrates the first diode 368 being a component of the force-sense device 202, the first diode 368 can be similarly provided externally to the force-sense device 202. For example, the first diode 368 can be coupled to the first calibration input node 228 outside of the force-sense device 202, or the first diode 368 can be provided in the auxiliary control circuit 206.

The example of FIG. 3 illustrates generally the device interface 314 coupling the first semiconductor device 304 and the second semiconductor device 308. The device interface 314 can include one or more signal paths configured to communicate information between the different semiconductor devices. The one or more electrical conductors can be configured for unidirectional or bidirectional communication. A number of signal paths, or conductors, in the device interface 314 can be minimized to simplify interconnection between the different semiconductor devices.

In an example, the first semiconductor device 304, such as comprising a portion of the PMU circuit, can be a lower-cost, lower-speed semiconductor device on or with which integrated devices can be built. For example, the first semiconductor device 304 can comprise a CMOS-type die with which CMOS-type switch devices can be built. The second semiconductor device 308, such as comprising another portion of the PMU circuit, the DCL circuit 230, or other circuits, can be a higher-cost, higher-speed semiconductor device on or with which integrated devices can be built. For example, the second semiconductor device 308 can comprise a bipolar-type die with which bipolar-type switch devices can be built. The first semiconductor device 304 and its attendant manufacturing processes can include or use fewer masks, larger lithography, greater tolerances, and can have greater overall yield when compared to the second semiconductor device 308.

In the example of FIG. 3, the first semiconductor device 304 and the second semiconductor device 308 include various interface nodes in communication with the auxiliary control circuit 206. For example, the first semiconductor device 304 includes the first auxiliary input node 376, the DUT current sense node 378, and the DUT voltage sense node 380. The second semiconductor device 308 includes the first calibration input node 228, the second auxiliary input node 382, and the third auxiliary input node 384.

The first semiconductor device 304 can further include various switch devices, including the sense amplifier output switch 348, the instrumentation amplifier output switch 336, the first sense switch 372, the second sense switch 374, and the feedback switch 330. In an example, the first semiconductor device 304 can include the first selector circuit 322, such as can comprise an integrated multiplexer device or discrete switches that are configured to implement the functions of a multiplexer. The various switches and the multiplexer can generally be more easily and more inexpensively implemented using the first semiconductor device 304 as compared to similar devices implemented using the second semiconductor device 308.

Integrating the switch devices with the first semiconductor device 304 of the multiple-die force-sense test system 300 provides various benefits for system calibration. For example, by providing the integrated switches, loading issues associated with external switches can be avoided, and a larger magnitude range of current signals can be used in calibration procedures. In an example without integrated switches providing access to drive circuitry in the test system, a large magnitude calibration current signal can be received by the test system using a relatively large external switch, and such a large switch can adversely load the DUT pin 128. Instead, by providing a calibration signal access point that is internal to the multiple-die force-sense test system 300, such as via the various integrated switches, external calibration circuitry can be used to control the integrated drive signal circuitry of the system, such as the output buffer circuitry of the multiple-die force-sense test system 300.

In the example of FIG. 3, the first semiconductor device 304 includes various device interface nodes for communicating with the second semiconductor device 308, such as using the device interface 314. The second semiconductor device 308 includes various device interface nodes for communicating with the first semiconductor device 304, such as using the device interface 314. For example, the first semiconductor device 304 includes a first device output node 346, a first device feedback node 350, and a first device dual-purpose node 352. The second semiconductor device 308 includes a second device input node 354, a second device feedback node 360, and a second device dual-purpose node 356. Various signal paths extending between the device interface nodes can comprise the device interface 314. For example, the device interface 314 can include a first signal path 324, a second signal path 328, and a bidirectional signal path 332. Generally, the first signal path 324 is a unidirectional signal path for communicating signals from the first semiconductor device 304 to the second semiconductor device 308, and the second signal path 328 is a unidirectional signal path for communicating signals from the second semiconductor device 308 to the first semiconductor device 304.

In an example, the first signal path 324 can transmit a force control signal 334 from the first semiconductor device 304 to the second semiconductor device 308. The first selector circuit 322 can be configured to provide the force control signal 334 at the first device output node 346, such as based on a signal from the auxiliary control circuit 206 or from the first force amplifier 310. The force control signal 334 can be transmitted using the first signal path 324 in the device interface 314 to the second device input node 354 at the second semiconductor device 308. In an example, the second device input node 354 is coupled to the buffer circuit network in the second semiconductor device 308. The buffer circuit network can include various buffer circuit instances that can be independently or selectively configured to provide an output signal to the DUT 130 in response to the force control signal 334.

The second signal path 328 can transmit a first DUT sense signal 342 from the second semiconductor device 308 to the first semiconductor device 304. The first DUT sense signal 342 can include a current or voltage signal received from the DUT 130, for example via the DUT sense resistor 370. The second semiconductor device 308 can provide the first DUT sense signal 342 at the second device feedback node 360, and the first semiconductor device 304 can receive the first DUT sense signal 342 at the first device feedback node 350.

The bidirectional signal path 332 can be configured to transmit a force-sense signal 338 between the first device dual-purpose node 352 at the first semiconductor device 304 and the second device dual-purpose node 356 at the second semiconductor device 308. Characteristics of the force-sense signal 338 can depend on an operating mode of the multiple-die force-sense test system 300. For example, in a test mode, the force-sense signal 338 can include an unbuffered, small-magnitude DUT force signal that is communicated from the first semiconductor device 304 to the DUT 130 by way of the second semiconductor device 308. In an auxiliary control mode or calibration mode, the force-sense signal 338 can include a second DUT sense signal that is received by the second semiconductor device 308 and communicated from the second semiconductor device 308 to the first semiconductor device 304.

In an example, the small-magnitude DUT force signal can be generated using a signal source on the first semiconductor device 304. In FIG. 3, the small-magnitude DUT force signal can be provided using at least one of a fourth range switch 318 and a fifth range switch 320. At least one of the fourth range switch 318 and the fifth range switch 320 can be configured to pass an output signal, such as from one of the first force amplifier 310 or from the auxiliary control circuit 206, to the first device dual-purpose node 352, and the fourth range switch 318 and the fifth range switch 320 can be independently-controlled. Respective signals provided via the fourth range switch 318 and the fifth range switch 320 can have different magnitude characteristics.

In an example, the bidirectional signal path 332 can be configured to transmit a force-sense signal 338 between the first device dual-purpose node 352 at the first semiconductor device 304 and the second device dual-purpose node 356 at the second semiconductor device 308 for calibration of the sense resistors R1-R3. For example, in a calibration mode, the force-sense signal 338 can include a calibration current signal that is conveyed from the first semiconductor device 304, via a third range switch 390, to the DUT node of the second semiconductor device 308. In an example, the third range switch 390 can be coupled to the first device dual-purpose node 352 and to a node that couples the first selector circuit 322, the fourth range switch 318, and the fifth range switch 320. The calibration current signal can be generated using a signal source on the first semiconductor device 304 or using the auxiliary control circuit 206. When the third range switch 390 is closed, a signal path is provided from calibration current signal source through a series combination of the sense resistors R1-R3 to the DUT node. A voltage across the series combination of R1-R3 resistors can be measured by the auxiliary control circuit 206 using, for example, signal information received via the first sense switch 372 and the second sense switch 374. If the resistances of the first and second sense resistors R1 and R2 are known, then the resistance of the sense resistor R3 can be calculated.

In another test mode of the multiple-die force-sense test system 300, the bidirectional signal path 332 can be configured to transmit the second DUT sense signal from the second semiconductor device 308 to the first semiconductor device 304. That is, the second semiconductor device 308 can receive DUT information from the DUT 130 and provide, at the second device dual-purpose node 356, the second DUT sense signal to the first device dual-purpose node 352 of the first semiconductor device 304. The second DUT sense signal can, in an example, be reported to a control system or can be received by the second selector circuit 326. In an example, the second device dual-purpose node 356 can provide the second DUT sense signal, and the second device feedback node 360 can concurrently provide the first DUT sense signal 342.

The example of the multiple-die force-sense test system 300 includes various switches, sources, signal paths, and other devices that can be independently or jointly configured to provide a small-magnitude DUT current force signal. However, fewer or additional switches, sources, signal paths, and/or other devices can similarly be used. The example of the multiple-die force-sense test system 300 includes three buffer circuits, including the first buffer circuit 306, the second buffer circuit 312, and the third buffer circuit 316, with corresponding respective sense resistors. However, fewer or additional buffer circuits and resistors can similarly be used.

Figure 4:
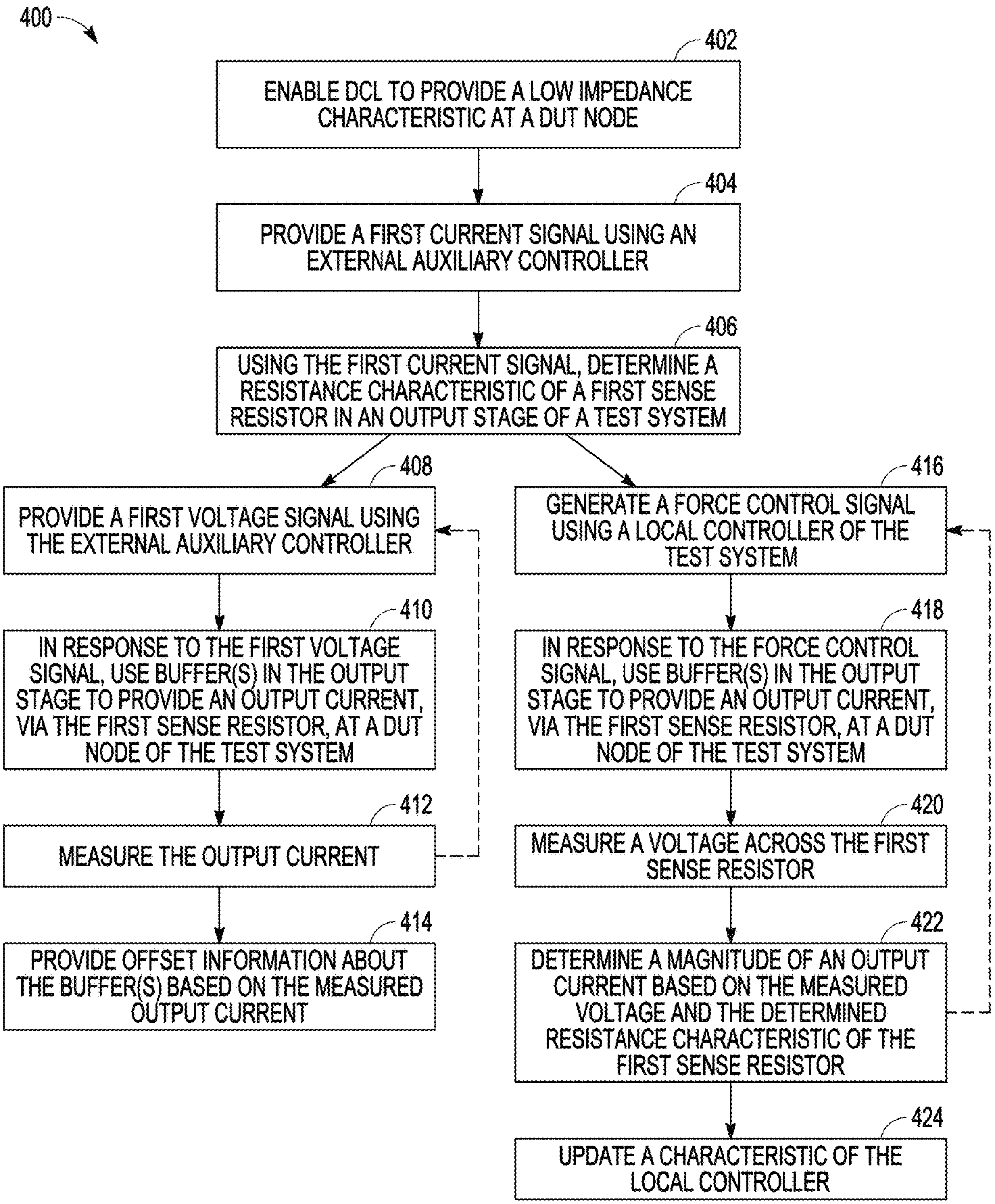
FIG. 4 illustrates generally an example of a first method that can include calibrating a portion of a test system.

FIG. 4 illustrates generally an example of a first method 400 that can include calibrating a portion of a test system. In an example, the first method 400 can include or use one or more of the first force-sense test system 200 or the multiple-die force-sense test system 300. Although the example first method 400 depicts a particular sequence of operations, the sequence may be altered without departing from the scope of the present disclosure.

At operation 402, the first method 400 can include preparing the test system for calibration by loading the DUT node of the system with a low impedance voltage source, such as by enabling an active load or driver (e.g., the DCL circuit 230) that is coupled to the DUT node.

At operation 404, the first method 400 includes providing a first current signal using an external auxiliary controller at operation 404.

At operation 406, the first method 400 includes using the first current signal to determine a resistance of a first sense resistor in an output stage of a test system. With the resistance known, the first method 400 can continue with additional operations to (1) calibrate or determine an accuracy of one or more buffers in the output stage of the test system, or (2) calibrate or determine an accuracy of a local (e.g., on-die) controller for the test system.

To calibrate or determine an accuracy of the one or more buffers in the output stage, the first method 400 can continue at operation 408. At the onset of operation 408, a DUT or other measurement device can be coupled to the DUT node. Operation 408 includes providing a first voltage signal using the external auxiliary controller. The first voltage signal can include an external control signal for one or more buffers in the output stage of the test system. Referring to the example of FIG. 3, operation 408 can include controlling the first selector circuit 322 to provide the external control signal from the auxiliary control circuit 206 to the second device input node 354.

At operation 410, in response to the first voltage signal, one or more of the buffers in the output stage can provide an output current at the DUT node of the test system. In an example, the one or more buffers provide the output current using a signal path that includes the first sense resistor. In an example, operation 410 includes determining a DUT voltage. Referring to the example of FIG. 3, operation 410 can include closing the first sense switch 372 and the second sense switch 374 to receive the DUT voltage information at the auxiliary control circuit 206.

At operation 412, the first method 400 includes measuring the output current at the DUT node. In an example, operation 412 includes using an external calibration system or device, such as the auxiliary control circuit 206, to measure the output current. If a magnitude of the measured output current is consistent with a specified relationship to the first voltage signal that was provided at operation 408, then the system can be considered to be calibrated or within tolerance. If the measured output current magnitude is inconsistent with the specified relationship to the first voltage signal, then the first method 400 can include iteratively updating a characteristic of the first voltage signal at operation 408 to thereby change an operating characteristic of the one or more buffers in the output stage and, accordingly, change the output current measured at operation 412.

In an example, the specified relationship between the output current and the first voltage signal indicates an offset characteristic for one or more components of the test system.

For example, the relationship can indicate an offset of one or more of the buffers in the output stage. At operation 414, the first method 400 can include providing or updating offset information for the one or more buffers based on the measured output current, to thereby calibrate operation of the system.

Returning to operation 406, after determining the resistance of the first sense resistor, the first method 400 can continue to calibrate or determine an accuracy of a local (e.g., on-die) controller for the test system. In an example, calibrating the local controller includes calibrating one or more aspects of the first force amplifier 310 or the first DAC 302 of the force-sense device 202.

For example, at operation 416, the first method 400 can include generating a force control signal using a local controller of the test system. In an example, operation 416 includes using the first DAC 302 to provide a test stimulus control signal to the first force amplifier 310 and, in response, the first force amplifier 310 provides the force control signal. Referring to the example of FIG. 3, operation 416 can include controlling the first selector circuit 322 to receive a local control signal from the first force amplifier 310 at the force control output node 224, and provide the local control signal from the first force amplifier 310 to the second device input node 354.

At operation 418, in response to the force control signal, one or more buffers in the output stage of the test system can provide an output current at a DUT node of the test system. In an example, the one or more buffers provide the output current using a signal path that includes the first sense resistor.

At operation 420, the first method 400 includes measuring a voltage across the first sense resistor. In an example, operation 420 includes using an external calibration system or device, such as the auxiliary control circuit 206, to measure the voltage. In another example, operation 420 includes using circuitry of the force-sense device 202 to measure the voltage.

At operation 422, the first method 400 includes determining a magnitude of an output current based on the measured voltage and the determined resistance of the first sense resistor. If a magnitude of the determined output current is consistent with a specified relationship to the test stimulus control signal for the local controller, then the system can be considered to be calibrated or within tolerance. If the determined output current is inconsistent with the specified relationship to the test stimulus control signal, then the first method 400 can include iteratively updating a characteristic of the test stimulus control signal at operation 416 to thereby change an operating characteristic of the one or more buffers in the output stage and, accordingly, change the output current determined at operation 422.

In an example, the specified relationship between the output current and the test stimulus control signal indicates an offset characteristic for one or more components of the test system. For example, the relationship can indicate an offset of the local controller, such as an offset of the first DAC 302 and/or the first force amplifier 310. At operation 424, the first method 400 can include providing or updating offset information for the local controller.

Figure 5:
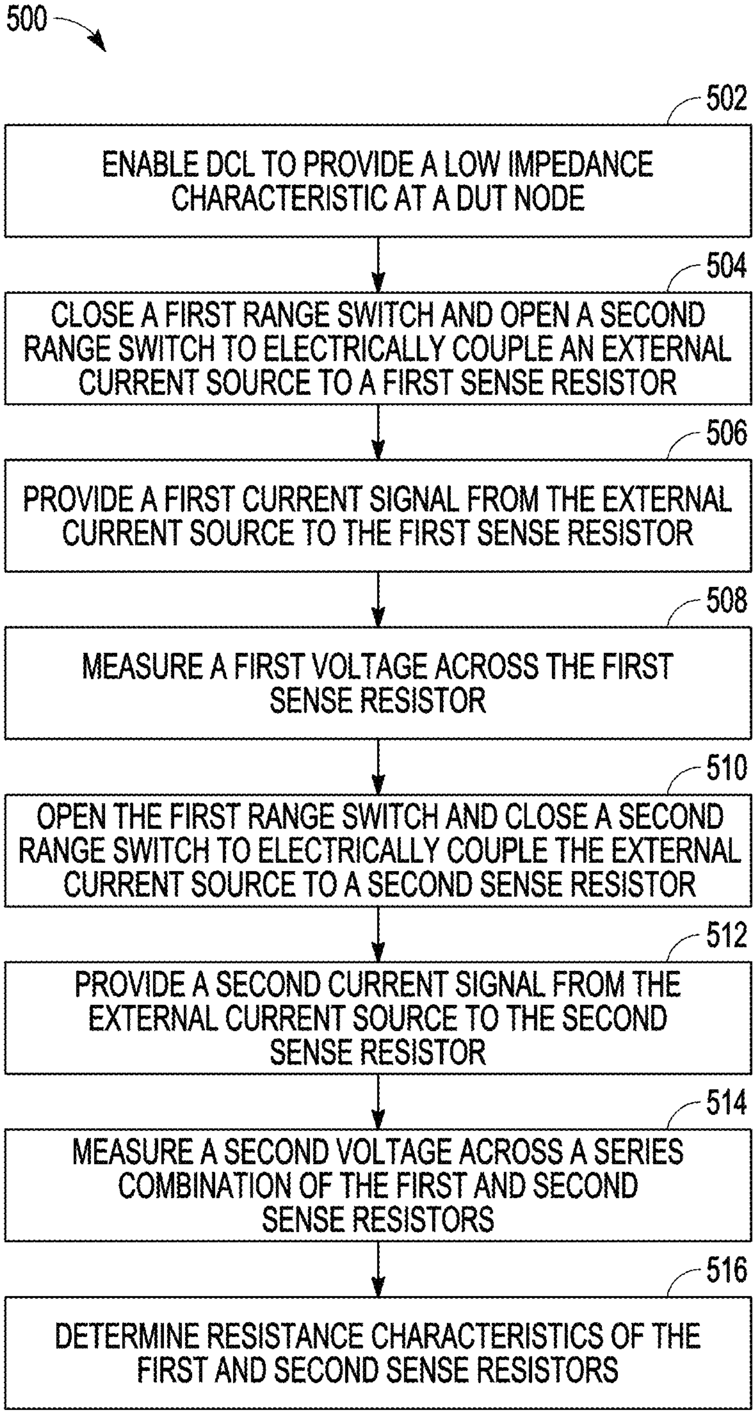
FIG. 5 illustrates generally an example of a second method that can include determining resistances of one or more sense resistors, or output resistors, in an output stage of a force-sense test system.

FIG. 5 illustrates generally an example of a second method 500 that can include determining resistances of one or more sense resistors, or output resistors, in the output stage of a test system. In an example, the second method 500 can include or use one or more of the first force-sense test system 200 or the multiple-die force-sense test system 300. Although the example second method 500 depicts a particular sequence of operations, the sequence may be altered without departing from the scope of the present disclosure. In an example, the second method 500 can include preparing the test system for calibration by loading the DUT node of the system with a low impedance voltage source, such as by enabling an active load or driver (e.g., the DCL circuit 230) that is coupled to the DUT node.

At operation 502, the second method 500 includes preparing the test system for calibration by loading the DUT node of the system with a low impedance voltage source, such as by enabling an active load or driver (e.g., the DCL circuit 230) that is coupled to the DUT node.

At operation 504, the second method 500 includes closing a first range switch and opening a second range switch to electrically couple an external current source to a first sense resistor. In an example, with reference to the multiple-die force-sense test system 300, operation 504 can include closing the first range switch 386 to electrically couple the first sense resistor R1 to the auxiliary control circuit 206, and operation 504 can further include opening the second range switch 388 to electrically decouple the second sense resistor R2 from the auxiliary control circuit 206.

At operation 506, the second method 500 includes providing a first current signal from the external current source to the first sense resistor. The first current signal can flow through the first sense resistor. At operation 508, the second method 500 includes measuring a first voltage across the first sense resistor, for example, while the first sense resistor receives the first current signal from the external current source.

At operation 510, the second method 500 includes opening the first range switch and closing the second range switch to electrically couple the external current source to a second sense resistor. In an example, with reference to the multiple-die force-sense test system 300, operation 510 can include closing the second range switch 388 to electrically couple the second sense resistor R2 to the auxiliary control circuit 206, and operation 510 can further include opening the first range switch 386 to electrically decouple the first sense resistor R1 from the auxiliary control circuit 206.

At operation 512, the second method 500 includes providing a second current signal from the external current source to the second sense resistor. The second current signal can flow, for example, through a series circuit that includes the first and second sense resistors. At operation 514, the second method 500 includes measuring a second voltage across the series combination of the first and second sense resistors, for example, while the resistors receive the second current signal from the external current source.

At operation 516, the second method 500 can include determining resistances of the first and second sense resistors. For example, a resistance of the first sense resistor can be determined using Ohm's law with the measured first voltage information from operation 508 and information about a magnitude of the first current signal provided by the external current source. A resistance of the series combination of the first and second sense resistors can similarly be determined using the measured second voltage information from operation 514 and information about a magnitude of the second current signal provided by the external current source. A resistance of the second output resistor can be determined by subtracting the determined resistance of the first sense resistor from the determined resistance of the series combination of the first and second sense resistors. The example of the second method 500 can be similarly applied to determine the resistances of one or more other sense resistors in the multiple-die force-sense test system 300.

Various aspects of the present disclosure can help provide a solution to the test system-related problems identified herein, as set forth in the following Examples.

Example 1 is a test equipment system for providing signals to, or receiving signals from, a device under test (DUT), the system comprising: output buffer circuitry configured to provide a DUT signal to the DUT at a DUT interface node in response to a force control signal at a buffer control node; a first sense resistor coupled to the DUT interface node and the output buffer circuitry; a first range switch coupled to the first sense resistor and an auxiliary driver input node; controller circuitry configured to provide the force control signal at the buffer control node; and an auxiliary control circuit configured to bypass the controller circuitry and selectively provide an auxiliary control signal at one of the buffer control node and the auxiliary driver input node.

In Example 2, the subject matter of Example 1 optionally includes the auxiliary control circuit configured to provide the auxiliary control signal as a current signal at the auxiliary driver input node.

In Example 3, the subject matter of Example 2 optionally includes voltage sense circuitry configured to measure a voltage signal across the first sense resistor in response to the current signal.

In Example 4, the subject matter of any one or more of Examples 1-3 optionally includes the auxiliary control circuit configured to provide the auxiliary control signal as a voltage signal at the buffer control node.

In Example 5, the subject matter of any one or more of Examples 1-4 optionally includes a bypass circuit configured to selectively couple the buffer control node to the controller circuitry or to the auxiliary control circuit.

In Example 6, the subject matter of any one or more of Examples 1-5 optionally includes the output buffer circuitry comprises multiple buffers coupled to the DUT using respective sense resistors, and one or more of the multiple buffers is selected to provide the DUT signal to the DUT interface node based on a characteristic of the force control signal at the buffer control node.

In Example 7, the subject matter of Example 6 optionally includes the multiple buffers comprising a first buffer coupled to the DUT interface node using the first sense resistor, and a second buffer coupled to the DUT interface node using the first sense resistor and a second sense resistor.

In Example 8, the subject matter of Example 7 optionally includes a second range switch configured to selectively couple a second driver input node to the second sense resistor.

In Example 9, the subject matter of Example 8 optionally includes a third buffer coupled to the DUT interface node using the first sense resistor, the second sense resistor, and a third sense resistor, and a third range switch configured to selectively couple the third sense resistor to receive the auxiliary control signal.

In Example 10, the subject matter of Example 9 optionally includes the third range switch comprising a portion of a first semiconductor die of a first semiconductor type, and the first range switch and the second range switch comprise portions of a second semiconductor die of a second semiconductor type.

Example 11 is a system for providing signals to, or receiving signals from, a device under test (DUT) at a DUT node, the system comprising: a first integrated circuit (IC) comprising a portion of a first semiconductor die of a first semiconductor type, the first IC comprising: a local controller configured to generate a local force control signal for a force-sense test system; and a bypass circuit configured to provide a buffer control signal to an output buffer circuit based on the local force control signal from the local controller or on an auxiliary control signal from an external auxiliary controller for the same force-sense test system; and a second IC comprising a portion of a second semiconductor die of a second semiconductor type, the second IC comprising: the output buffer circuit; a first sense resistor coupled to a first buffer and the DUT node; and a first range switch coupled to the first sense resistor and an auxiliary driver input node, wherein the auxiliary driver input node is configured to receive an auxiliary drive signal from the external auxiliary controller.

In Example 12, the subject matter of Example 11 optionally includes the second IC comprising: a second sense resistor coupled to a second buffer and the first sense resistor; and a second range switch coupled to the second sense resistor and a second driver input node, and the second driver input node is configured to receive the auxiliary drive signal from the external auxiliary controller.

In Example 13, the subject matter of any one or more of Examples 11-12 optionally includes the second IC comprising a third sense resistor, and the first IC comprises a third range switch coupled to the third sense resistor and configured to receive the auxiliary drive signal from the external auxiliary controller.

In Example 14, the subject matter of Example 13 optionally includes the first IC comprising a fourth sense resistor and a fourth range switch, the fourth sense resistor is coupled between the third and fourth range switches, and the fourth range switch is configured to receive the auxiliary drive signal from the external auxiliary controller.

In Example 15, the subject matter of any one or more of Examples 11-14 optionally includes the external auxiliary controller, and the external auxiliary controller comprises a calibration signal source configured to provide a calibration signal for calibrating the first sense resistor and the first buffer.

Example 16 is a method for calibrating an automated test equipment (ATE) system, the method comprising: using a first current signal from an external auxiliary controller, determining a resistance of a first sense resistor, wherein the first sense resistor is coupled to a device under test (DUT) node of the system; in response to a first voltage control signal from the external auxiliary controller, using one or more buffers in an output stage of the system to provide an output current at the DUT node via the first sense resistor; measuring the output current at the DUT node; and providing offset information about the one or more buffers in the output stage based on the measured output current.

In Example 17, the subject matter of Example 16 optionally includes determining the resistance of the first sense resistor including providing the first current signal to the first sense resistor using a first range switch; measuring a first voltage across the first sense resistor using second and third switches; and determining the resistance of the first sense resistor based on a magnitude of the first current signal and the measured first voltage. In Example 17, the second and third switches comprise a portion of a first semiconductor die of a first semiconductor type, and the first range switch comprises a portion of a second semiconductor die of a second semiconductor type.

In Example 18, the subject matter of any one or more of Examples 16-17 optionally includes determining the resistance of the first sense resistor including closing a first range switch to provide a signal path from the external auxiliary controller to the first sense resistor, wherein the first range switch is coupled to a first buffer output of the one or more buffers in the output stage; measuring a first voltage across the first sense resistor; and determining the resistance using information about a magnitude of the first current signal and the measured first voltage.

In Example 19, the subject matter of Example 18 optionally includes determining a resistance of a second sense resistor using a second current signal from the external auxiliary controller, and the second sense resistor is coupled between the first sense resistor and a second buffer output of the one or more buffers in the output stage.

In Example 20, the subject matter of Example 19 optionally includes determining the resistance of the second sense resistor including opening the first range switch and closing a second range switch to provide a signal path from the external auxiliary controller to the second sense resistor; providing a second current signal to a series combination of the first and second sense resistors using the second range switch; measuring a second voltage across the series combination of the first and second sense resistors; and determining the resistance using information about a magnitude of the second current signal and the measured second voltage.

Example 21 is a method for calibrating an automated test equipment (ATE) system, the method comprising: using a first current signal from an external auxiliary controller, determining a resistance of a first sense resistor, wherein the first sense resistor is coupled to a device under test (DUT) node of the system; generating a first force control signal using a local controller for a parametric measurement unit of the system; receiving the force control signal at output buffer circuitry and, in response, providing a first DUT signal to a DUT at the DUT node, and measuring a voltage across the first sense resistor; determining a current at the DUT node based on the measured voltage and the determined resistance of the first sense resistor; and updating a characteristic of the local controller based on the determined current at the DUT node.

In Example 22, the subject matter of Example 21 optionally includes updating the characteristic of the local controller, including updating an offset for a digital-to-analog converter (DAC) circuit that is configured to control operation of the local controller.

Example 23 is at least one non-transitory, machine-readable medium including instructions that, when executed by processing circuitry, cause the processing circuitry to perform operations to implement of any of Examples 1-22.

Example 24 is an apparatus comprising means to implement of any of Examples 1-22.

Example 25 is a system to implement of any of Examples 1-22.

Each of these non-limiting Examples can stand on its own, or can be combined in various permutations or combinations with one or more of the other examples or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A test equipment system for providing signals to, or receiving signals from, a device under test (DUT), the system comprising:

output buffer circuitry configured to provide a DUT signal to the DUT at a DUT interface node in response to a force control signal at a buffer control node;

a first sense resistor coupled to the DUT interface node and the output buffer circuitry;

a first range switch coupled to the first sense resistor and an auxiliary driver input node;

controller circuitry configured to provide the force control signal at the buffer control node; and an auxiliary control circuit configured to bypass the controller circuitry and selectively provide an auxiliary control signal at one of the buffer control node and the auxiliary driver input node.

2. The test equipment system of claim 1, wherein the auxiliary control circuit is configured to provide the auxiliary control signal as a current signal at the auxiliary driver input node.

3. The test equipment system of claim 2, comprising voltage sense circuitry configured to measure a voltage signal across the first sense resistor in response to the current signal.

4. The test equipment system of claim 1, wherein the auxiliary control circuit is configured to provide the auxiliary control signal as a voltage signal at the buffer control node.

5. The test equipment system of claim 1, comprising a bypass circuit configured to selectively couple the buffer control node to the controller circuitry or to the auxiliary control circuit.

6. The test equipment system of claim 1, wherein the output buffer circuitry comprises multiple buffers coupled to the DUT using respective sense resistors, and wherein one or more of the multiple buffers is selected to provide the DUT signal to the DUT interface node based on a characteristic of the force control signal at the buffer control node.

7. The test equipment system of claim 6, wherein the multiple buffers comprise:

a first buffer coupled to the DUT interface node using the first sense resistor; and a second buffer coupled to the DUT interface node using the first sense resistor and a second sense resistor.

8. The test equipment system of claim 7, comprising a second range switch configured to selectively couple a second driver input node to the second sense resistor.

9. The test equipment system of claim 8, comprising:

a third buffer coupled to the DUT interface node using the first sense resistor, the second sense resistor, and a third sense resistor; and a third range switch configured to selectively couple the third sense resistor to receive the auxiliary control signal.

10. The test equipment system of claim 9, wherein the third range switch comprises a portion of a first semiconductor die of a first semiconductor type, and wherein the first range switch and the second range switch comprise portions of a second semiconductor die of a second semiconductor type.

11. A system for providing signals to, or receiving signals from, a device under test (DUT) at a DUT node, the system comprising:

a first integrated circuit (IC) comprising a portion of a first semiconductor die of a first semiconductor type, the first IC comprising:

a local controller configured to generate a local force control signal for a force-sense test system; and a bypass circuit configured to provide a buffer control signal to an output buffer circuit based on the local force control signal from the local controller or on an auxiliary control signal from an external auxiliary controller for the same force-sense test system; and a second IC comprising a portion of a second semiconductor die of a second semiconductor type, the second IC comprising:

the output buffer circuit;

a first sense resistor coupled to a first buffer and the DUT node; and a first range switch coupled to the first sense resistor and an auxiliary driver input node, wherein the auxiliary driver input node is configured to receive an auxiliary drive signal from the external auxiliary controller.

12. The system of claim 11, wherein the second IC comprises:

a second sense resistor coupled to a second buffer and the first sense resistor; and a second range switch coupled to the second sense resistor and a second driver input node, wherein the second driver input node is configured to receive the auxiliary drive signal from the external auxiliary controller.

13. The system of claim 11, wherein the second IC comprises a third sense resistor; and wherein the first IC comprises a third range switch coupled to the third sense resistor and configured to receive the auxiliary drive signal from the external auxiliary controller.

14. The system of claim 13, wherein the first IC comprises a fourth sense resistor and a fourth range switch;

wherein the fourth sense resistor is coupled between the third and fourth range switches; and wherein the fourth range switch is configured to receive the auxiliary drive signal from the external auxiliary controller.

15. The system of claim 11, comprising the external auxiliary controller, wherein the external auxiliary controller comprises a calibration signal source configured to provide a calibration signal for calibrating the first sense resistor and the first buffer.

16. A method for calibrating an automated test equipment (ATE) system, the method comprising:

using a first current signal from an external auxiliary controller, determining a resistance of a first sense resistor, wherein the first sense resistor is coupled to a device under test (DUT) node of the system;

in response to a first voltage control signal from the external auxiliary controller, using one or more buffers in an output stage of the system to provide an output current at the DUT node via the first sense resistor;

measuring the output current at the DUT node; and providing offset information about the one or more buffers in the output stage based on the measured output current.

17. The method of claim 16, wherein determining the resistance of the first sense resistor includes:

providing the first current signal to the first sense resistor using a first range switch;

measuring a first voltage across the first sense resistor using second and third switches; and determining the resistance of the first sense resistor based on a magnitude of the first current signal and the measured first voltage;

wherein the second and third switches comprise a portion of a first semiconductor die of a first semiconductor type, and wherein the first range switch comprises a portion of a second semiconductor die of a second semiconductor type.

18. The method of claim 16, wherein determining the resistance of the first sense resistor includes:

closing a first range switch to provide a signal path from the external auxiliary controller to the first sense resistor, wherein the first range switch is coupled to a first buffer output of the one or more buffers in the output stage;

measuring a first voltage across the first sense resistor; and determining the resistance using information about a magnitude of the first current signal and the measured first voltage.

19. The method of claim 18, comprising determining a resistance of a second sense resistor using a second current signal from the external auxiliary controller, wherein the second sense resistor is coupled between the first sense resistor and a second buffer output of the one or more buffers in the output stage.

20. The method of claim 19, wherein determining the resistance of the second sense resistor includes:

opening the first range switch and closing a second range switch to provide a signal path from the external auxiliary controller to the second sense resistor;

providing a second current signal to a series combination of the first and second sense resistors using the second range switch;

measuring a second voltage across the series combination of the first and second sense resistors; and determining the resistance using information about a magnitude of the second current signal and the measured second voltage.

21. A method for calibrating an automated test equipment (ATE) system, the method comprising:

using a first current signal from an external auxiliary controller, determining a resistance of a first sense resistor, wherein the first sense resistor is coupled to a device under test (DUT) node of the system;

generating a first force control signal using a local controller for a parametric measurement unit of the system;

receiving the force control signal at output buffer circuitry and, in response, providing a first DUT signal to a DUT at the DUT node, and measuring a voltage across the first sense resistor;

determining a current at the DUT node based on the measured voltage and the determined resistance of the first sense resistor; and updating a characteristic of the local controller based on the determined current at the DUT node.

22. The method of claim 21, wherein updating the characteristic of the local controller includes updating an offset for a digital-to-analog converter (DAC) circuit that is configured to control operation of the local controller.

* * * * *